United States Patent [19]

Tourville et al.

[11] Patent Number: 5,541,523
[45] Date of Patent: Jul. 30, 1996

[54] SYSTEM FOR DETECTING OPERABILITY OF AN AIRBAG SQUIB RESISTOR

[75] Inventors: Jon Tourville, Colorado Springs; Christopher J. Kemp, Monument, both of Colo.

[73] Assignee: Ford Motor Company, Dearborn, Mich.

[21] Appl. No.: 308,312

[22] Filed: Sep. 19, 1994

[51] Int. Cl.⁶ .................................................. G01R 27/26
[52] U.S. Cl. ............................ 324/711; 340/438; 280/735
[58] Field of Search ............................ 340/438; 324/705, 324/711; 280/735; 307/10.1

[56] References Cited

U.S. PATENT DOCUMENTS

| | | | |
|---|---|---|---|
| 4,001,676 | 1/1977 | Hile et al. | 324/711 |
| 4,362,988 | 12/1982 | Weimer . | |
| 4,492,916 | 1/1985 | Johnson . | |
| 4,893,109 | 1/1990 | Vrabel et al. | 340/438 |
| 4,987,372 | 1/1991 | Ofori-Tenkorang et al. . | |
| 4,990,884 | 2/1991 | McCurdy | 340/438 |
| 5,081,442 | 1/1992 | Ito et al. . | |
| 5,187,465 | 2/1993 | Stonebrook | 340/438 |
| 5,293,153 | 3/1994 | Rochette | 340/438 |
| 5,331,211 | 7/1994 | Kondo | 340/438 |

*Primary Examiner*—Maura K. Regan
*Attorney, Agent, or Firm*—Mark L. Mollon; Roger L. May

[57] ABSTRACT

A circuit for determining the operability an airbag squib resistor. The circuit includes a current source, the squib resistor to be measured, a first resistor whose resistance is equal to the minimum acceptable resistance of the squib resistor, a second resistor whose resistance is equal to the maximum acceptable resistance of the squib resistor, a voltage-to-current converter, a capacitor, a comparator, and a microprocessor with a counter. A first switch connects the squib resistor and first and second resistors in series. A second switch couples the inputs of the voltage-to-current converter individually across the squib resistor and first and second resistors. As the second switch is coupled to the squib resistor, the first resistor or second resistor, a third switch is opened to initiate charging of the capacitor which is coupled to the output of the voltage-to-current converter. A time measurement is made of the time required for the capacitor to charge to a predetermined threshold voltage. The time measurement is made with the second switch in each of its three states. The time measurements are compared and the squib resistor is deemed inoperative if the time measurement for the squib resistor is not within the range established by the time measurements for the first resistor and the second resistor.

17 Claims, 4 Drawing Sheets

5,541,523

SYSTEM FOR DETECTING OPERABILITY OF AN AIRBAG SQUIB RESISTOR

FIELD OF THE INVENTION

The present invention relates generally to electronic testing systems and more particularly to an arrangement for testing the operability of a vehicle airbag system.

BACKGROUND OF THE INVENTION

Airbag systems utilized in vehicles typically utilize a resistor, known as an airbag squib resistor, as a trigger resistor to enable the airbag to be inflated when specified conditions are met. To ensure timely inflation of the airbag, it is helpful to periodically monitor the resistance of the airbag squib resistor during operation of the vehicle. Determining whether the resistance of the airbag squib resistor is within acceptable levels while the vehicle is in operation requires the airbag squib resistor to be tested in a manner which does not cause inflation of the airbag. The testing is further complicated by variations in the supply voltage and electrical noise while the vehicle is in operation and also by process variations which may occur in the manufacture of the circuitry of the airbag system.

SUMMARY OF THE INVENTION

It is an object of the present invention to determine the operability of a vehicle airbag system, by accurately determining whether the resistance of one or more squib resistors in the vehicle airbag system is within a predetermined range, despite the presence of certain variations in process variables and environmental effects such as temperature, electrical noise and voltage and current variations.

In accordance with the primary object of the invention the operability of an airbag squib resistive element is determined by measuring a first value indicative of the resistance of a first resistive element which has a resistance corresponding to a minimum acceptable resistance value for the airbag squib resistive element, and measuring a second value indicative of the resistance of a second resistive element which has a resistance corresponding to a maximum acceptable resistance value for the airbag squib resistive element. A third value indicative of the resistance of the airbag squib resistive element is then measured and is compared to the first value and to the second value. An airbag inoperative condition is set if the third value is not between the first value and the second value.

An advantage of at least certain preferred embodiments is that the operability of the airbag squib resistor may be accurately verified during operation of the vehicle, without damaging the squib resistor if a short circuit occurs, and despite process variations in the fabrication of circuit components, or the presence of electrical noise or other physical effects present in vehicle electrical systems.

These and other features and advantages of the present invention may be better understood by considering the following detailed description of preferred embodiments of the invention. In the course of this description, reference will be made to the attached drawings.

DETAILED DESCRIPTION

Figure 1:
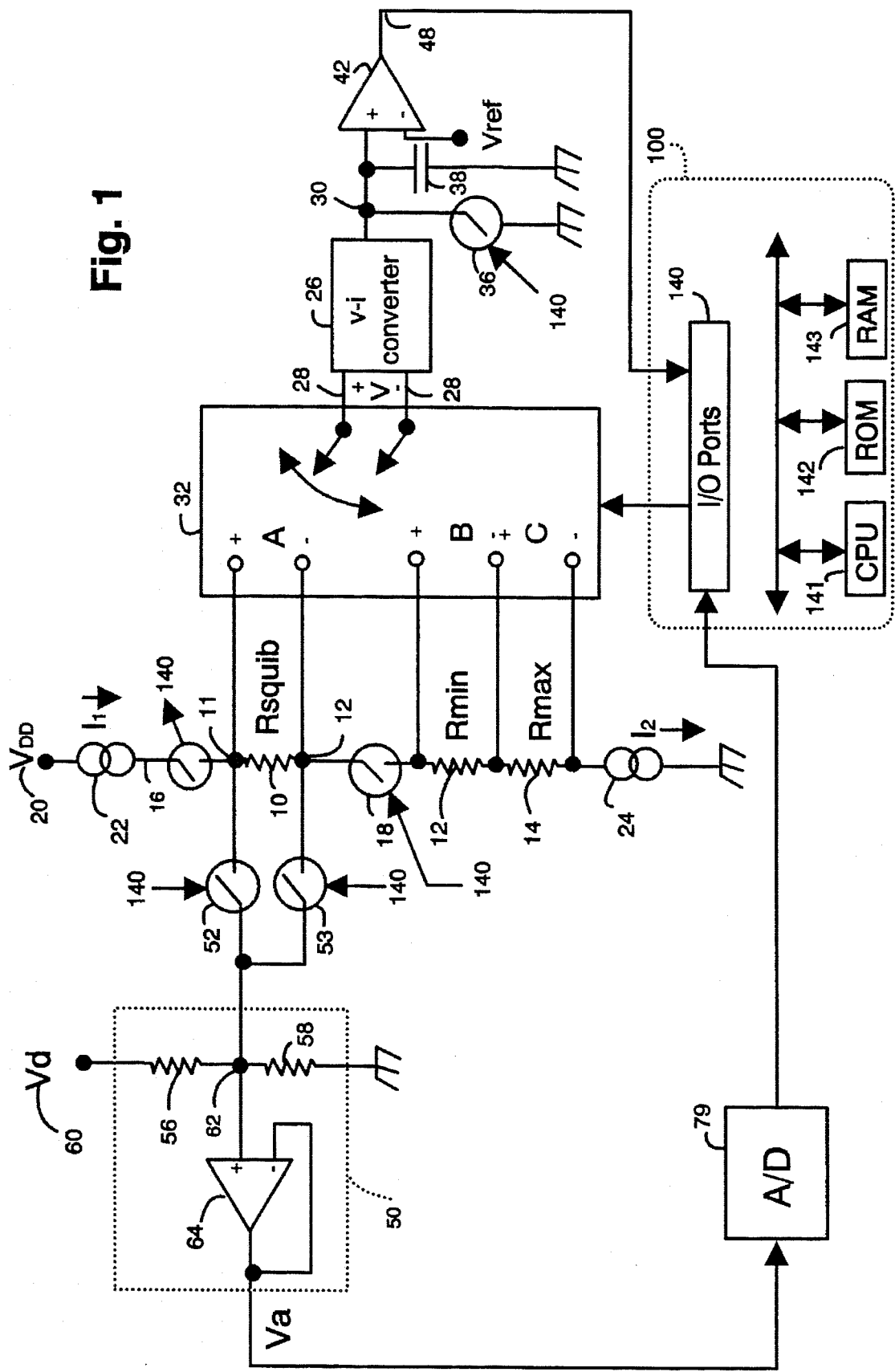
FIG. 1 is a schematic diagram of a preferred embodiment.

FIG. 1 shows a preferred embodiment of an airbag squib testing circuit which is advantageously contained within a vehicle airbag system. In FIG. 1a first current source 22 generates a current $I_1$ and a second current source 24 generates a current $I_2$. In a preferred embodiment second current source 24 produces a nominal current of 50 mA. First current source 22 produces nominally about four-thirds as much current as second current source 24, or approximately 65 mA. Therefore, with switches 16 and 18 closed, current $I_2$ which is nominally 50 mA flows through the series combination of $R_{squib}$, $R_{min}$ and $R_{max}$. The use of the two current sources 22 and 24 advantageously reduces the likelihood that squib resistor 10 will be blown if one of its terminals is shorted to ground. First current source 22 is advantageously limited to prevent blowing resistors 10, 12 and 14 and to prevent excessive current flow in the event that a short circuit to ground is created.

As noted above, current $I_2$ flows through the series combination of a switch 16, squib resistor $R_{squib}$, seen at 10, switch 18, a resistor $R_{min}$, seen at 12, and another resistor $R_{max}$ seen at 14 when switches 16 and 18 are in a closed position. $R_{min}$ and $R_{max}$ are advantageously fixed value zero temperature coefficient resistors. $R_{min}$ advantageously has a resistance which is indicative of a minimum resistance value for $R_{squib}$ in order for it to operate properly in inflating the airbag. $R_{max}$ advantageously has a resistance which is indicative of a maximum resistance value for $R_{squib}$ in order for it to operate properly in inflating the airbag. Preferably, $R_{min}$ has a nominal value of 1 ohm and $R_{mx}$ has a nominal value of 3.5 ohms.

Switches 16 and 18, which are coupled to I/O port 140 of ACU 100, operate under control of ACU 100 to control current flow through resistors $R_{squib}$, $R_{min}$ and $R_{max}$. Switches 16 and 18 are preferably implemented as field effect transistors (FETs) with a drain resistance while conducting of approximately 10 to 20 ohms or less.

A switch 32, coupled to I/O port 140 of ACU 100, operates under control of ACU 100 to couple inputs 28 of a voltage-to-current (V–I) converter 26 across individually $R_{squib}$, $R_{min}$ or $R_{max}$. Switch 32 can be controlled by microprocessor 33 to be in a first state in which the inputs of switch 32 are decoupled from $R_{squib}$, $R_{min}$ or $R_{max}$, a second state in which the inputs of switch 32 are coupled to receive the voltage existing across $R_{squib}$, a third state in which the inputs of switch 32 are coupled to receive the voltage existing across $R_{min}$, and a fourth state in which the inputs of switch 32 are coupled to receive the voltage existing across $R_{max}$. Switch 32 may take a variety of known forms and preferably takes the form of a solid state device.

Voltage-to-current converter 26 operates under known methods to generate a current at its output 30 which is proportional to the voltage received at inputs 28. A switch 36 and a capacitor 38 are coupled in parallel to output 30 of V–I converter 26. Switch 36, which is coupled to I/O port 140 of ACU 100, operates under control of ACU 100 to initiate and control charging and discharging of capacitor 38. A comparator in the form of voltage comparator 42 has a non-inverting input coupled to the output 30 of V–I converter 26 and an inverting input coupled to a predetermined reference voltage $V_{ref}$. Output 48 of voltage comparator 42 is coupled to an I/O port 140 of ACU 100. Voltage comparator 42 operates to generate a binary signal on output 48. Output 48 will be high if the voltage at the non-inverting input is greater than the voltage at the inverting input and output 48 will be low if the voltage drop at the non-inverting input is less then the voltage at the inverting input. Thus, as can be seen, voltage comparator 42 generates a logical "1" when the voltage across capacitor 38 exceeds predetermined threshold voltage $V_{ref}$, and a logical "0" otherwise.

Airbag Control Unit (ACU) 100 comprises a microcomputer including a central processor unit (CPU) 141, input and output (I/O) port 140, read only memory (ROM) 142 for storing control programs, random access memory (RAM) 143, for temporary data storage which may also be used for counters or timers, and a conventional data bus. ACU 100 operates under stored program control to receive input signals, and to generate output signals to control various operational and diagnostic aspects of the vehicle airbag system.

Circuit 50 is used for a short-test of the squib resistor 10. Circuit 50 includes switches 52 and 53 controlled by ACU 100, and resistors 56 and 58 which form a voltage divider connected to a voltage source $V_d$ seen at 60. Resistors 56 and 58 are coupled at node 62 which is connected to the non-inverting terminal of an operational amplifier 64. The operational amplifier*s output terminal is connected to its inverting terminal so that its output voltage is equal to the voltage at node 62, in order to perform a voltage follower function.

Figure 2:
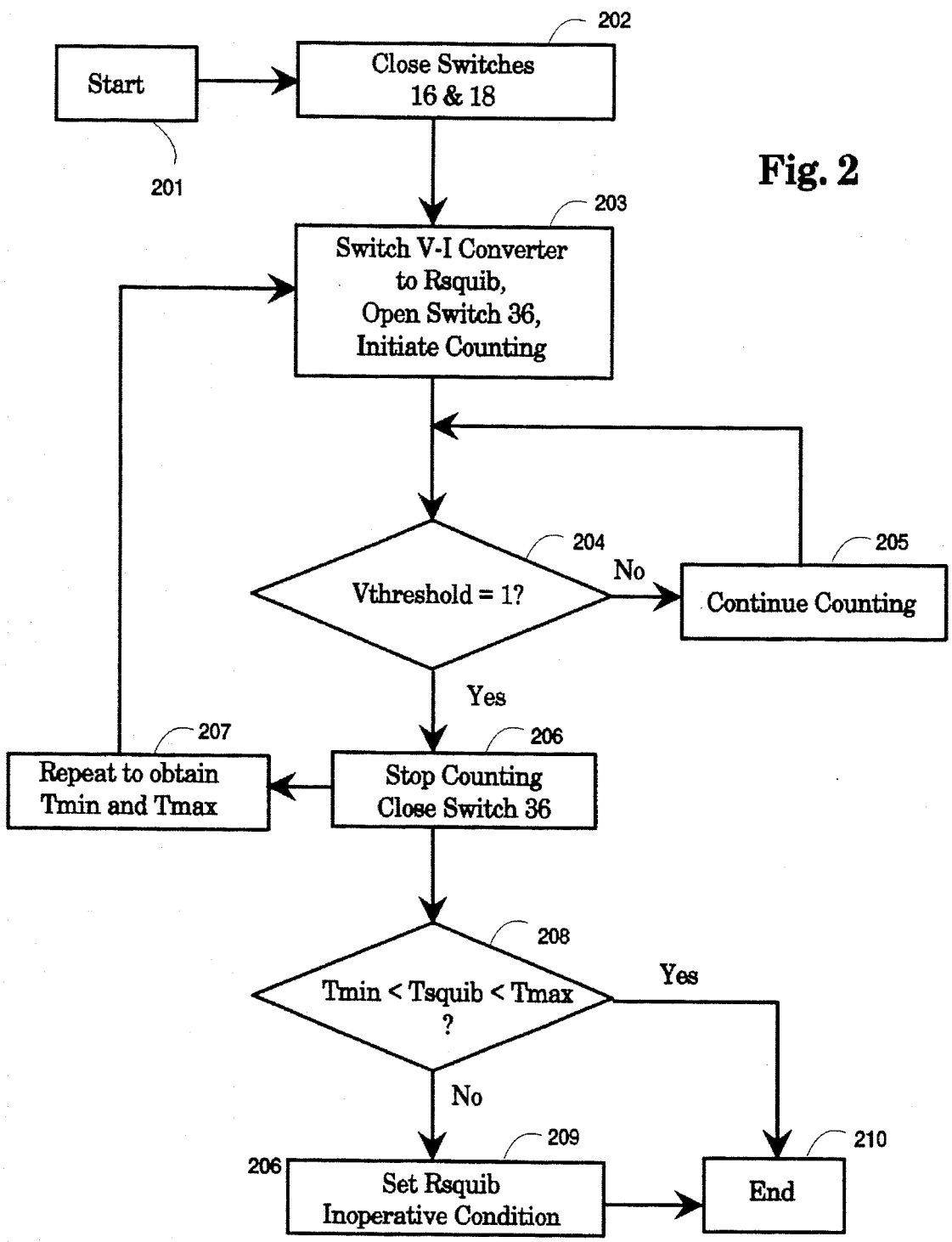
FIGS. 2 and 3 are flowcharts of the operation of a preferred embodiment.

FIG. 2 of the drawings shows the steps utilized in a preferred embodiment to determine whether the resistance of airbag squib resistor $R_{squib}$ is within a predetermined range. The steps shown in FIG. 2 are preferably implemented in the form of a stored program executed by ACU 100.

The routine is entered at 201 and at 202 switches 16 and 18 are closed resulting in current $I_2$ flowing through the series combination of $R_{squib}$, $R_{min}$ and $R_{max}$. At 203, inputs 28 of V–I converter 26 are switched so as to receive the voltage across $R_{squib}$. Inputs 28 of V–I converter 26 have a high input impedance so that the current flowing through $R_{squib}$, $R_{min}$ or $R_{max}$ when the V–I converter is coupled across either resistor is substantially the same as current $I_1$. As explained, above current $I_1$ is limited by $I_2$, thus the current flowing through $R_{squib}$, $R_{min}$ or $R_{max}$ is substantially equal to current $I_2$. Also at 203, switch 36 is opened and a time measurement, $T_{squib}$ is initiated preferably by starting the counting of a counter within ACU 100. As can be seen, the opening of switch 36 initiates charging of capacitor 38. At steps 204 and 205, the time measurement continues by periodically incrementing the counter within ACU 100, in response to a system clock contained within ACU 100, until the output 48 of voltage comparator 42 generates a logical "1" signal, which as explained above, occurs when the voltage across capacitor reaches a voltage greater than the predetermined threshold voltage $V_{ref}$.

At 206, the time measurement is stopped by disabling counting of the counter within ACU 100, the value $T_{squib}$ is stored by ACU 100 and switch 36 is closed to discharge capacitor 38. Steps 203 to 206 are repeated to generate a time measurement for $T_{min}$ corresponding to $R_{min}$ and a time measurement $T_{max}$ corresponding to $R_{max}$. As will be apparent to those skilled in the art in view of the present disclosure, the order in which the time measurement for $R_{squib}$, $R_{min}$ and $R_{max}$ is taken may be altered.

As explained above, current $I_2$ flows through the series combination of $R_{squib}$, $R_{min}$ and $R_{max}$. The time (T) required for capacitor 38 to charge to voltage $V_{ref}$ is given by the following relationship:

$$T = \frac{V_{ref} * c}{I}$$

where, c is the capacitance of capacitor 38, and I, which is the current flowing through capacitor 33 represents the following relationship:

$$I = KI_2 * (R_{squib}, R_{min}, R_{max}),$$

where K is a constant indicative of a gain provided by V–I converter 26. Substituting for I, yields the following relationships for time measurments $T_{squib}$, $T_{min}$ and $T_{max}$.

$$T_{squib} = \frac{cV_{ref}}{KI_2 R_{squib}}$$

$$T_{min} = \frac{cV_{ref}}{KI_2 R_{min}}$$

$$T_{max} = \frac{cV_{ref}}{KI_2 R_{max}}$$

Thus, the time measurement taken for voltage 42 to generate a logical "1" with switch 32 in each of its three positions ($T_{squib}$, $T_{min}$ and $T_{max}$) can be used to determine whether the resistance of $R_{squib}$ is greater than the resistance of $R_{min}$ and less than the resistance of $R_{max}$ by comparing measured values $T_{squib}$, $T_{min}$ and $T_{max}$ which represent values which are inversely proportional to the resistance of the corresponding resistor.

At 208, $T_{squib}$ is compared to $T_{min}$ and $T_{max}$. If $T_{squib}$ is less than $T_{min}$ and greater than $T_{max}$, then the resistance of $R_{squib}$ is determined to be within an acceptable range, and the routine is ended at 210. Otherwise, an $R_{squib}$ inoperative condition within ACU 100 is set at 209 and the routine is ended. In a preferred embodiment, the setting of the $R_{squib}$ inoperative condition results in an indication to the vehicle operator that the airbag system is not operating properly.

Figure 3:
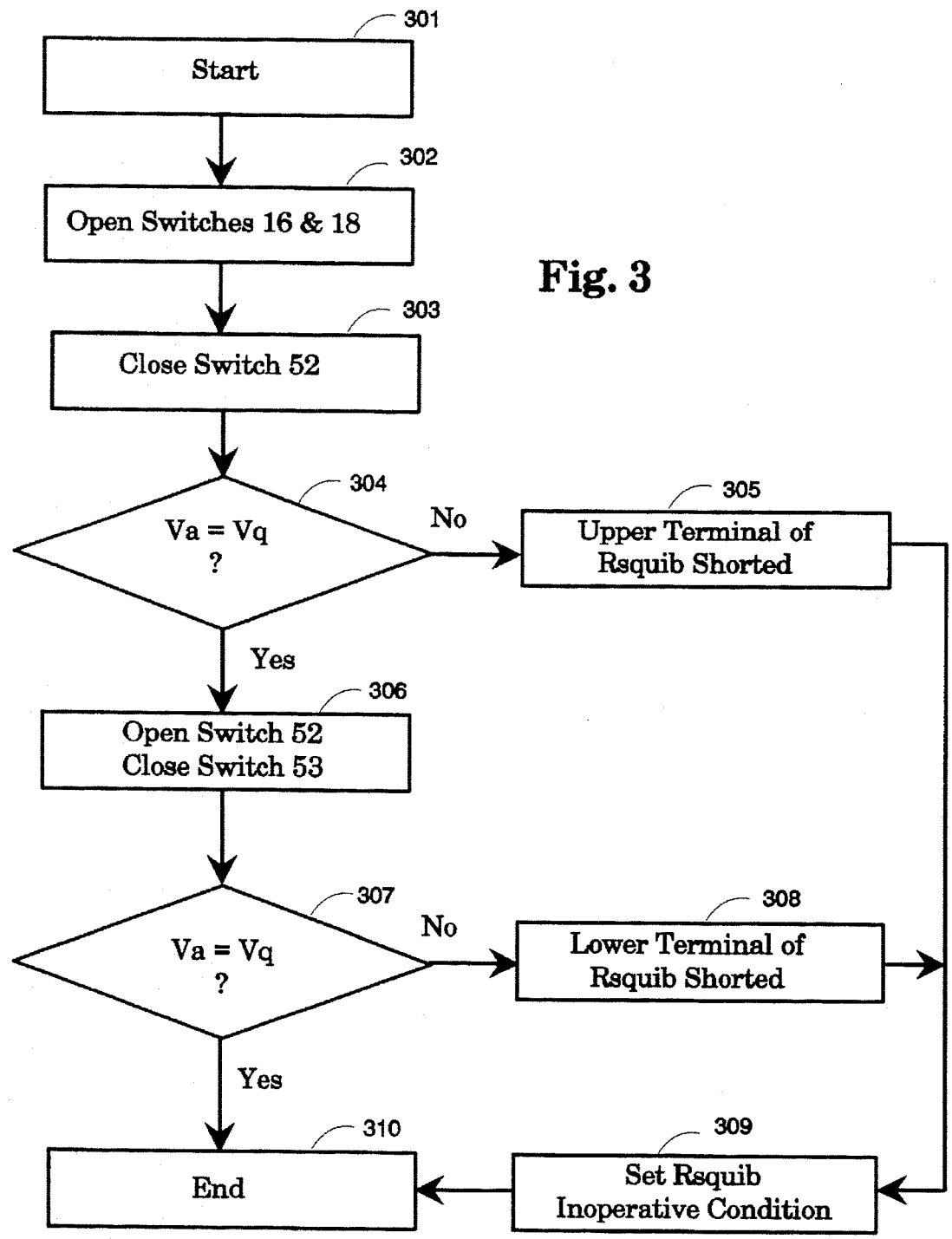

FIG. 3 shows the steps conducted by ACU 100 to determine whether or not $R_{squib}$ is shorted to ground. Switches 52 and 53 are normally in an open position. In such a position, output voltage $V_a$ of the operational amplifier 64 has a quiescent value $V_q$ determined by resistors 56 and 58 and voltage $V_D$. Under proper operation, with switches 16 and 18 in an open position, squib resistor 10 normally is floating, that is, none of its terminals is connected directly or indirectly to ground. At 302 switches 16 and 18 are opened, and at 303, switch 52 is closed to test whether the upper terminal of squib resistor 10 is shorted. If $R_{squib}$ is operating properly then at 303 when switch 52 is closed, voltage $V_a$ will remain equal to its quiescent voltage $V_q$. If a short exists between the upper terminal of $R_{squib}$, shown in FIG. 1 at 11, then $V_a$ will equal a value other than $V_q$. Such a comparison is performed at step 304. Voltage $V_a$, is converted to a digital value by analog-to-digital (A/D) converter 79 received by ACU 100 through I/O port 140 and compared to a stored digitally expressed value corresponding to $V_q$. If $V_a$ does not equal $V_q$ then a condition in ACU 100 is set to indicate that the upper terminal of $R_{squib}$ is shorted, the $R_{squib}$ inoperative condition is set at 309 and the routine is exited at 310. As will be apparent to those skilled in the art in view of the present disclosure, $V_a$ may vary over a predetermined range and be considered equal to $V_q$. Such a feature allows for minor variations in $V_q$ due to environmental factors or process variations. At 306, switch 52 is opened and switch 53 is closed to perform a similar test, at steps 306–309, on the lower terminal, seen at 12, of $R_{squib}$.

Figure 4:
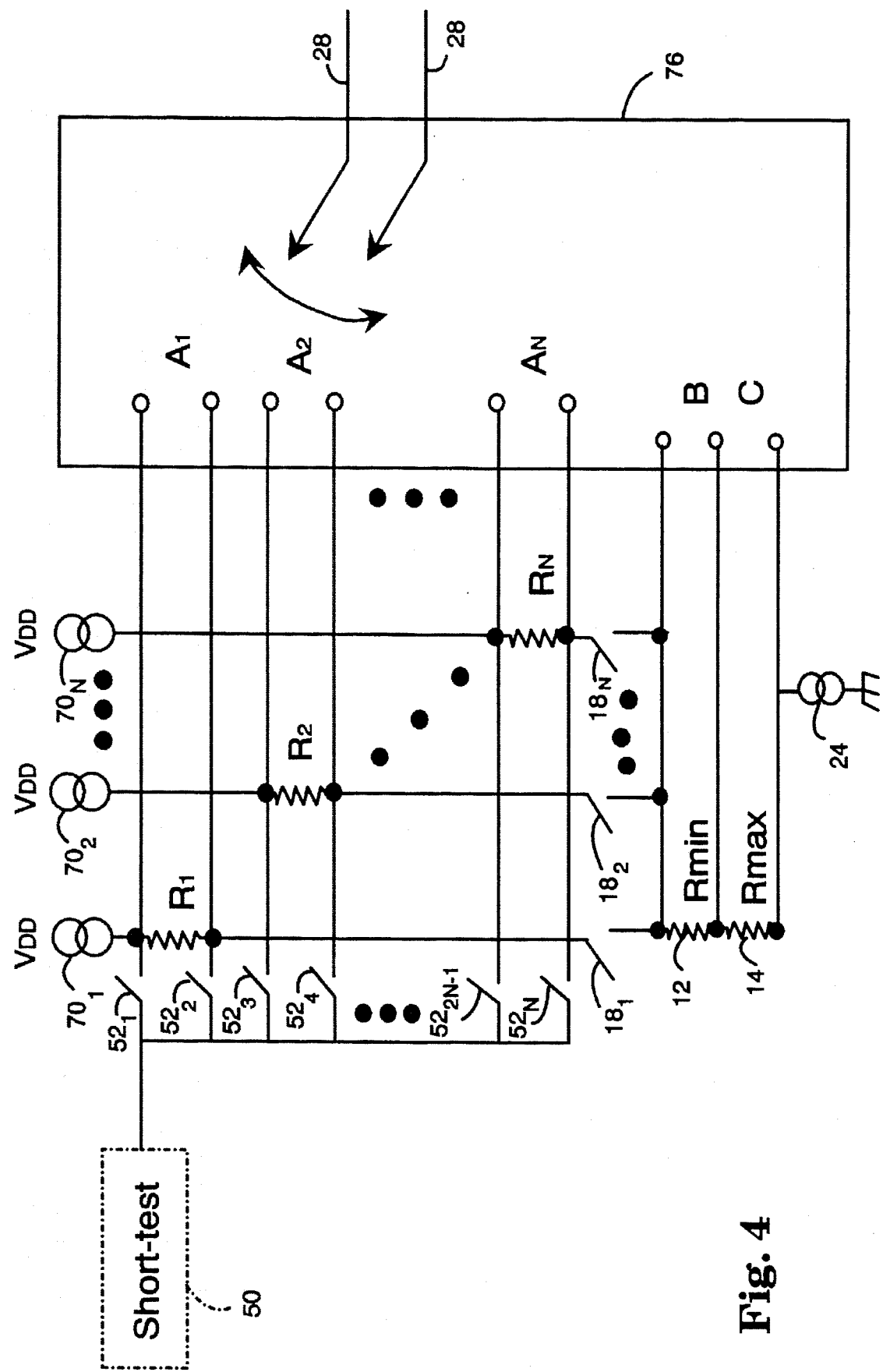
FIG. 4 is a schematic diagram of a second preferred embodiment.

FIG. 4 shows an alternative embodiment in which the airbag system includes a plurality or airbag squib resistors and a mechanism for testing operability of each of the airbag squib resistors. FIG. 4 shows an apparatus for testing N airbag squib resistors, where N is an integer. As seen in FIG. 4, the mechanism of FIG. 1 has been modified to include additional switching devices. Components in FIG. 4 labeled 18, 28, 30, 12, 14, 24, 50, and 52 are identical in kind to the same referenced components in FIG. 1. Explicitly shown in FIG. 4 are three squib resistors labeled $R_1$, $R_2$, and $R_N$ which collectively comprise a total of N squib resistors. Each one of the devices labeled $70_1$ through $70_N$ serves the combined functions of a switch and a current limited pull-up. Each such device is preferably a PMOS FET with a properly biased gate. In an alternative embodiment, devices $70_1$ through $70_N$ may take the form of a single current source with N switches, each corresponding to a squib resistor $R_1$ through $R_N$. There are N such devices, with three being explicitly shown. Switches labeled $18_1$ to $18_N$ each corresponding to one of the squib resistors $R_1$ to $R_N$. Each of the switches 18 operate to couple the corresponding squib resistor in series with resistors $R_{min}$ and $R_{max}$. Each squib resistor additionally has two corresponding switches labelled $52_1$ to $52_{2N}$ which operate to individually couple each of the two terminals of the corresponding squib resistor to short-test circuitry 50. Switch 76 is similar to 32 of FIG. 1 in that inputs 28 and 30 may be connected across each one of the plurality of squib resistors via N positions $A_1, A_2, \ldots, A_N$.

To measure the resistance of a squib resistor, say $R_2$, switches 52 are placed in an open state. Among switches 18, the switch $18_2$ which is connected directly to $R_2$ is placed in closed state and the rest are turned off. Devices 70 are turned off except for device $70_2$ which is connected directly to $R_2$ and is energized. Switch 76 connects inputs 28 to position $A_2$. The rest of the steps follow that of the discussion for FIG. 1.

To perform a short-test on $R_2$, devices 70 and switches 18 are placed in an open state. Among switches 52, only those two directly connected to $R_2$ are to be turned on, but only one at a time. The rest of the steps follow that of the discussion for FIG. 1.

With the exception of ACU 100, the apparatus shown in FIGS. 1 and 4 are preferably contained on a single integrated circuit. Alternatively, all of the components including ACU 100 shown may be integrated onto a single integrated ciruit.

As will be apparent to those skilled in the art, the system described herein provides numerous advantages. The squib resistor being measured or tested need not be disconnected from the airbag circuit during testing. At all times during the measurement of the squib resistor, the current flowing through the squib resistor is kept low so as not to inadvertently detonate the airbag controlled by the squib resistor. Furthermore, measuring the resistance of the squib resistor by measuring time intervals required for charging the capacitor from zero voltage to the reference voltage as previously discussed provides good noise immunity because of the integration functions performed by the capacitor. Moreover, the testing system described allows for greater process variation in device fabrication.

It is to be understood that the specific mechanisms and techniques which have been described are merely illustrative of one application of the principles of the invention. Numerous modifications may be made to the methods and apparatus described without departing from the true spirit and scope of the invention.

What is claimed is:

1. A method of measuring the operability of an airbag squib resistive element, comprising the steps of:

measuring a first value indicative of the resistance of a first resistive element which has a resistance corresponding to a minimum acceptable resistance value for said airbag squib resistive element;

measuring a second value indicative of the resistance of a second resistive element which has a resistance corresponding to a maximum acceptable resistance value for said airbag squib resistive element;

measuring a third value indicative of the resistance of said airbag squib resistive element;

comparing said third value to said first value and to said second value; and setting an airbag inoperative condition if said third value is not between said first value and said second value.

2. The method as set forth in claim 1 wherein said airbag squib resistive element is installed in a vehicle airbag system and said method is performed periodically during operation of said vehicle.

3. The method as set forth in claim 2 wherein the first resistive element, the second resistive element and the airbag squib resistive element are connected in series.

4. The method as set forth in claim 3 wherein the steps of measuring the first value, the second value and the third value each comprise the steps of:

coupling the series connection of said first resistive element, said second resistive element and said airbag squib resistive element in series with a current source, and for the value to be measured, detecting the individual voltage drop across the resistive element, generating a current proportional to said detected voltage drop, charging a capacitor with said current, measuring the time required for said capacitor to charge to a predetermined voltage, and determining the value as a function of said measured time.

5. The method as set forth in claim 4 wherein the step of measuring the time required for said capacitor to charge to a predetermined voltage comprises the steps of:

initiating counting of a digital counter upon initiation of charging of said capacitor;

stopping counting of said digital counter when the voltage across said capacitor reaches said predetermined voltage; and determining said measured time as a function of the state of said digital counter.

6. The method as set forth in claim 5 wherein the first resistive element, the second resistive element and the airbag squib resistive element are connected in series by a plurality of solid state switches.

7. The method as set forth in claim 1 wherein the airbag squib resistive element comprises two terminals and wherein the method comprises the additional steps of testing each terminal of said airbag squib resistive element for a short circuit and setting said airbag inoperative condition if a short circuit exists at either of said terminals.

8. Apparatus for determining the operability of a vehicle airbag system comprising:

an airbag squib resistor;

a first resistor coupled in series with said airbag squib resistor and having a resistance indicative of a minimal acceptable airbag squib resistance;

a second resistor coupled in series with said airbag squib resistor and having a resistance indicative of a maximum acceptable airbag squib resistance;

a current source for supplying a substantially constant current through said series combination of said first resistor, said second resistor and said airbag squib resistor;

resistance detection means for generating a resistance value indicative of the individual resistance of said first resistor, said second resistor and said airbag squib resistor; and comparison means responsive to said resistance detection means for comparing the individual resistance values for said first resistor, said second resistor and said airbag squib resistor and setting an airbag inoperative condition if the resistance value of said airbag squib resistor is less than the resistance value of said first resistor or greater than the resistance value of said second resistor.

9. Apparatus as set forth in claim 8 wherein said resistance detection means comprises:

a voltage-to-current converter having a pair of inputs for receiving a voltage differential across the inputs and an output for supplying a current proportional to said voltage differential, a first switch for selectively coupling the inputs of said voltage-to-current converter across said first resistor, said second resistor and said airbag squib resistor, a capacitor coupled to the output of said voltage-to-current converter;

a second switch, responsive to the coupling of the inputs of said voltage-to-current converter across said first resistor, said second resistor or said airbag squib resistor, for initiating charging of said capacitor, and a voltage comparator, coupled to said capacitor and to a reference voltage, for generating a signal when the voltage across said capacitor exceeds said reference voltage, and a digital counter, responsive to said signal, for determining the amount of time required for said capacitor to exceed said reference voltage.

10. Apparatus as set forth in claim 9 wherein the digital counter is contained within a microprocessor.

11. Apparatus as set forth in claim 10 wherein said microprocessor generates control signals for controlling operation of said first and said second switch.

12. Apparatus as set forth in claim 11 wherein said current source comprises a first current source and a second current source, said current source controlling the maximum amount of current flowing through said first resistor, said second resistor and said airbag squib resistor.

13. Apparatus as set forth in claim 12 wherein said first resistor and said second resistor are fixed value zero temperature coefficient resistors.

14. Apparatus as set forth in claim 8 wherein the airbag squib resistor comprises two terminals and wherein the apparatus further comprises means for testing each terminal of said airbag squib resistor for a short circuit and setting said airbag inoperative condition if a short circuit exists at either of said terminals.

15. Apparatus for determining the operability of an airbag squib resistor which is installed in a vehicle airbag system, comprising:

a first resistor having a resistance indicative of a minimal acceptable airbag squib resistance;

a second resistor coupled in series with said first and having a resistance indicative of a maximum acceptable airbag squib resistance;

a first switch, responsive to a first switch signal, for coupling said airbag squib resistor in series with said first resistor and said second resistor;

a current source for supplying a substantially constant current;

a second switch, responsive to a second switch signal, for coupling said current source to said series combination of said airbag squib resistor, said first switch, said first resistor and said second resistor;

a voltage-to-current converter having a pair of inputs to receive a voltage, and an output to transmit a current proportional to the received voltage;

a third switch, responsive to a third switch signal, for coupling the inputs of said voltage-to-current converter to receive a voltage across said airbag squib resistor, said first resistor or said second resistor;

a capacitive element coupled to the output of said voltage-to-current converter;

a fourth switch, responsive to a fourth switch signal, for controlling charging and discharging of said capacitive element;

a voltage comparator generating a threshold signal when the voltage across said capacitive element exceeds a predefined threshold voltage; and an airbag control unit comprising,
  means for periodically generating an airbag test signal,
  means responsive to said airbag test signal for determining a resistance value indicative of the individual resistance of said first resistor, said second resistor and said airbag squib resistor, and
  means responsive to said resistance values for comparing the resistance value of of said first resistor, said second resistor and said airbag squib resistor, and for generating an airbag squib resistor inoperative condition if the resistance value of said airbag squib resistor is less than the resistance of said first resistor or greater than the resistance of said second resistor.

16. Apparatus as set forth in claim 15 wherein said means responsive to said airbag test signal for determining a resistance value indicative of the individual resistance of said first resistor, said second resistor and said airbag squib resistor comprises:

first means for generating said first and said second switch signals in order to close said first and said second switches and for generating said third switch signal in order to couple the inputs of said voltage-to-current converter across either of said first resistor, said second resistor or said airbag squib resistor;

second means, responsive to said first means, for generating said fourth switch signal in order to open said fourth switch to initiate charging of said capacitive element, and further responsive to said threshold signal in order to close said switch to initiate discharging of said capacitive element;

third means, responsive to said second means, for initiating counting of a digital counting means;

fourth means, responsive to said threshold signal, for stopping counting of said digital counting means; and fifth means, responsive to said fourth means, for determining the resistance value of the resistor coupled to the inputs of said voltage-to-current converter as a function of the state of said digital counting means.

17. Apparatus as set forth in claim 16 wherein the airbag squib resistor comprises two terminals and wherein the apparatus further comprises means for testing each terminal of said airbag squib resistor for a short circuit and generating said airbag inoperative condition if a short circuit exists at either of said terminals.

* * * * *